(12) United States Patent
Chen et al.

(10) Patent No.: US 9,083,326 B2
(45) Date of Patent: Jul. 14, 2015

(54) SIGNAL TRANSMITTING ASSEMBLY FOR CUTTING OFF DRIVING SIGNAL FOR DRIVING DESIGNATED LIGHT SOURCE AND ELECTRONIC APPARATUS HAVING THE SAME

(75) Inventors: Chun-Hung Chen, Taipei (TW); Tzu-Chi Liu, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 139 days.

(21) Appl. No.: 13/243,279

(22) Filed: Sep. 23, 2011

(65) Prior Publication Data

US 2012/0146987 A1 Jun. 14, 2012

(30) Foreign Application Priority Data

Dec. 14, 2010 (CN) .......................... 2010 1 0609260

(51) Int. Cl.
*G09G 5/00* (2006.01)
*H03K 5/151* (2006.01)

(52) U.S. Cl.
CPC ...................... *H03K 5/151* (2013.01)

(58) Field of Classification Search
CPC .................. G09G 2370/14; G09G 2310/0291; G09G 3/3406; G09G 2310/08
USPC .......... 345/211–213; 330/301, 117, 133, 150, 330/51, 157
See application file for complete search history.

(56) References Cited

U.S. PATENT DOCUMENTS

| | | | |
|---|---|---|---|
| 7,109,897 B1 * | 9/2006 | Levesque | 341/67 |
| 2003/0174023 A1 * | 9/2003 | Miyasita | 330/254 |
| 2007/0146284 A1 | 6/2007 | Kota | |
| 2010/0149081 A1 * | 6/2010 | Shen | 345/88 |
| 2010/0301758 A1 | 12/2010 | Chen | |
| 2011/0032233 A1 * | 2/2011 | Nishimura | 345/211 |
| 2011/0084953 A1 * | 4/2011 | Lee et al. | 345/212 |
| 2011/0164020 A1 * | 7/2011 | Cho et al. | 345/211 |

FOREIGN PATENT DOCUMENTS

CN 1574672 A 2/2005

* cited by examiner

*Primary Examiner* — Dennis Joseph
*Assistant Examiner* — Chun-Nan Lin

(57) ABSTRACT

A signal transmitting circuit is provided for cutting off or outputting at least one driving signal for driving a designated light source. The signal transmitting circuit includes an input differential signaling driver, an output differential amplifier, and a fixed-voltage-level-difference supply device. The input differential signaling driver is for receiving a display signal, and outputting an inverting signal and a non-inverting signal according to the display signal. The output differential amplifier is for receiving the inverting signal and non-inverting signal and outputting or cutting off the driving signal according to the voltage-level difference between the inverting signal and the non-inverting signal. The fixed-voltage-level-difference supply device is for supplying a fixed-voltage-level difference to replace the inverting signal and the non-inverting signal received by the output differential amplifier; therefore the output of the output differential amplifier remains low voltage-level to cut off the output of light with a designated color.

15 Claims, 18 Drawing Sheets

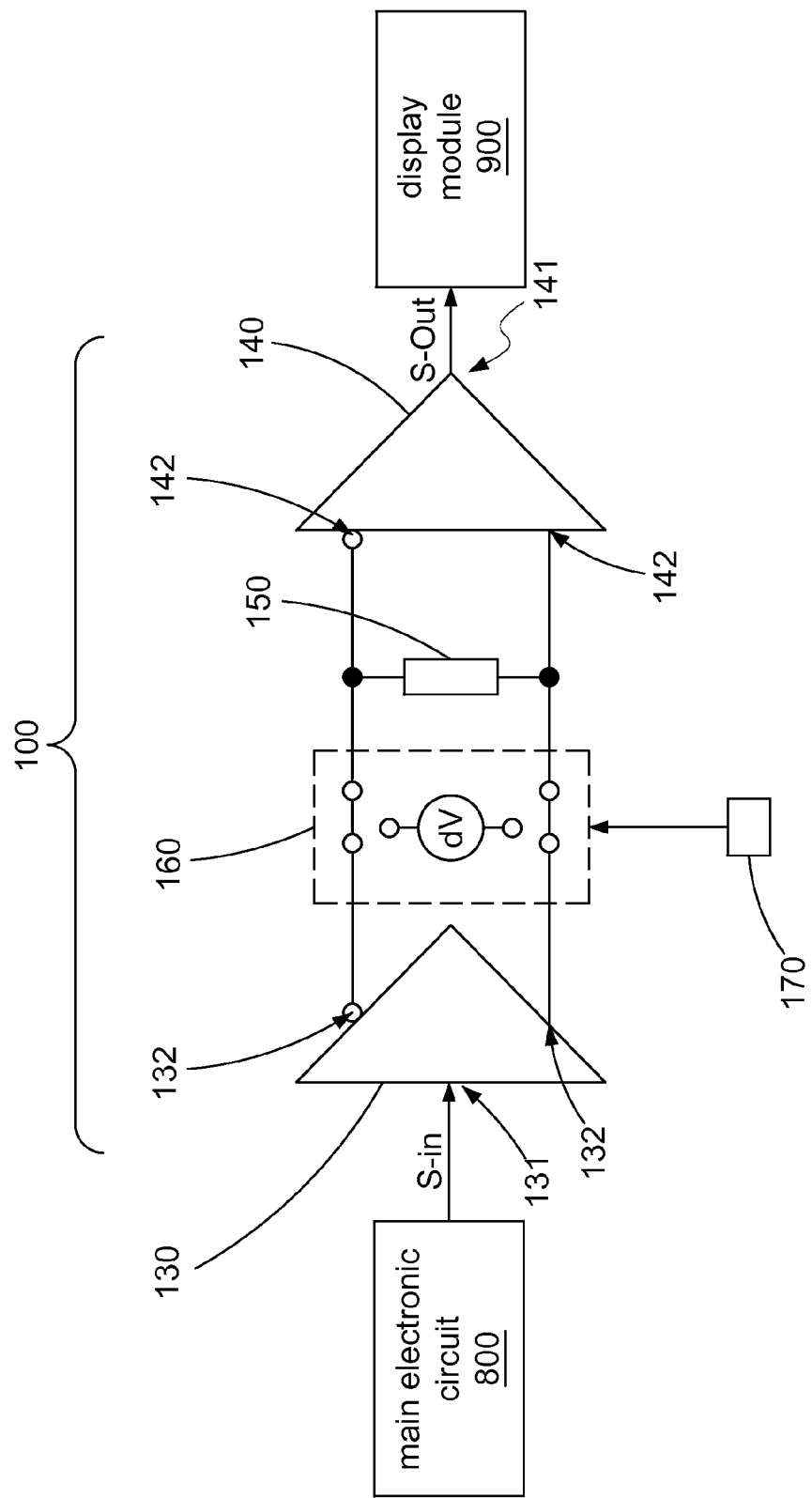

SIGNAL TRANSMITTING ASSEMBLY FOR CUTTING OFF DRIVING SIGNAL FOR DRIVING DESIGNATED LIGHT SOURCE AND ELECTRONIC APPARATUS HAVING THE SAME

BACKGROUND OF THE INVENTION

1. Technical Field

The disclosure relates signal transmitting circuit of driving signal for driving a light source, and more particularly, to a signal transmitting circuit for cutting off the driving signal for driving a designated light source, and a display module and an electronic apparatus equipped with the signal transmitting circuit.

2. Related Art

The Night Vision Imaging System (NVIS) generates a relatively large gain for a red light. When a user observes a display device through the NVIS, the NVIS will generate relatively large gain for red light and infrared light emitted by the display device. Due to the aforementioned reason, the images displayed by the display device will have a high brightness and low contrast in the NVIS, and it is difficult for the user to clearly observe the display device through the NVIS.

In practice, the approach for observing display device through the NVIS is to attach an optical filter on the display panel of the display device to cut off light other than 400 nm-600 nm wavelength light. Through the optical filter, the red light emitted by the display panel is cut off as possible. However, the cost of the optic filter is high. Moreover, if an optical filter is attached to the display panel of a touch-control display device, the optic filter interferes with the operation of a touch-control interface. Therefore, the aforementioned approach is not suitable for a display device with touch-control interface.

The display device displays variant colors by mixing red, green, and blue colors of red, green, and blue pixel cells. When observing the display device through the NVIS, another approach is to cut off red light from red pixel cells to prevent the display device from emitting red light and infrared light, and than it is possible for the user to clearly observe the images on the display device through the NVIS.

Different from a common desktop computer in which the computer host and display device are separated, in a portable electronic apparatus, a laptop computer, or an all-in-one computer, the display signal generated by the main electronic circuit is transmitted to a driving circuit of a display module through Low-Voltage Differential Signaling (LVDS) mechanism performed by a Low-Voltage Differential Signaling transmitter (LVDS transmitter).

Please refer to FIG. 1; an LVDS transmitter in the art includes an input differential signaling driver 1 and an output differential amplifier 2. The input differential signaling driver 1 is provided for receiving a display signal S-in and generating an inverting signal and a non-inverting signal according to the display signal S-in. Then, the input differential signaling driver 1 transmits the inverting signal and the non-inverting signal to the output differential amplifier 2 through signal lines 3, 4. The output differential amplifier 2 determines a driving signal S-out for driving a designated light source to be high-voltage-level or low-voltage level according to the voltage-level difference between the inverting signal and the non-inverting signal, and then transmits the driving signal S-out to the driving circuit of the display panel.

Please refer to FIG. 2. When observing display device through the NVIS, the driving signal for driving the display device to emit red light has to be cut off. The approach for cutting off red light is to dispose two change-over switches 5, 6 in the LVDS transmitter 1. When red light has to be cut off, the two change-over switches 5, 6 respectively enable two receiving points of the output differential amplifier 2 to be electrically grounded, therefore the voltage-level difference between two receiving points of the output differential amplifier 2 remain at zero. Theoretically, the outputting points of the output differential amplifier 2 will remain at low-voltage level instead of output the driving signal for driving designated light source corresponding to red light. Since the driving signal for driving designated light source corresponding to red light is cut off, the display device stop emitting red light.

In fact, even though two receiving points of the output differential amplifier 2 are electrically grounded, some external facts such as Electromagnetic interference (EMI) may generate high voltage pulse two any one of the two receiving points of the output differential amplifier 2. Such high voltage pulse cause that the voltage-level difference between two receiving points of the output differential amplifier 2 can not continuously remain at zero when the two receiving points are electrically grounded. As a result, the output differential amplifier 3 occasionally output the driving signal and the display device is occasionally or continuously driven to emit red light.

SUMMARY

In the prior art, the approach for observing the display device through NVIS is to attach an optical filter to the display panel or to cut off the driving signal corresponding to red light in an LVDS transmitter. However, the cost of the optic filter is high, and the LVDS transmitter is easily interfered by noise signal and can not effectively cut off the driving signal corresponding to red light.

In order to effectively cut off the driving signal corresponding to a designated color light (e.g. red light), this disclosure provides a signal transmitting circuit for cutting off or outputting at least one driving signal for driving a designated light source. The signal transmitting circuit comprises an input differential signaling driver, an output differential amplifier, and a fixed-voltage-level-difference supply device.

The input differential signaling driver is provided for receiving a display signal for driving the designated light source, and outputting an inverting signal and a non-inverting signal according to the display signal.

The output differential amplifier is provided for receiving the inverting signal and the non-inverting signal, and outputting or cutting off the driving signal for driving the designated light source according to the voltage-level difference between the inverting signal and the non-inverting signal.

The fixed-voltage-level-difference supply device is electrically connected between the input differential signaling driver and the output differential amplifier to be switched to a cut-off state.

In cut-off state, the fixed-voltage-level-difference supply device supplies a fixed-voltage-level difference to replace the inverting signal the non-inverting signal received by the output differential amplifier, so as to switch the output differential amplifier to cut off the driving signal for driving the designated light source.

This disclosure also provided an electronic apparatus, which comprises the aforementioned signal transmitting circuit, a display panel, and a panel driving circuit. Examples of the electronic apparatus include a laptop computer, a display device, a tablet computer, a mobile phone, and a personal digital assistant (PDA).

The display panel comprises a plurality of pixel cells. The panel driving circuit is for receiving the driving signal for driving the designated light source from the output differential amplifier, so as to enable at least one of the pixel cells of the display panel.

In one or more embodiments, the electronic apparatus further comprises a main electronic circuit for generating the driving signal.

As cutting off the driving signal for driving the designated light source corresponding to red light (or other designated color light), the approach in the embodiment of this disclosure is to supply a fixed-voltage-level difference from the fixed-voltage-level-difference supply device to the output differential amplifier, so as to keep the outputting of the output differential amplifier at low-voltage level without being interfered by noise signals from the display signal or external facts, thereby effectively cutting off the red light (or other designated color light).

BRIEF DESCRIPTION OF THE DRAWINGS

The present invention will become more fully understood from the detailed description given herein below for illustration only, and thus not limitative of the present invention, wherein:

FIG. 5A and FIG. 5B are examples of the first embodiment, in which a method for generating a switching signal is illustrated;

DETAILED DESCRIPTION

Figure 1:
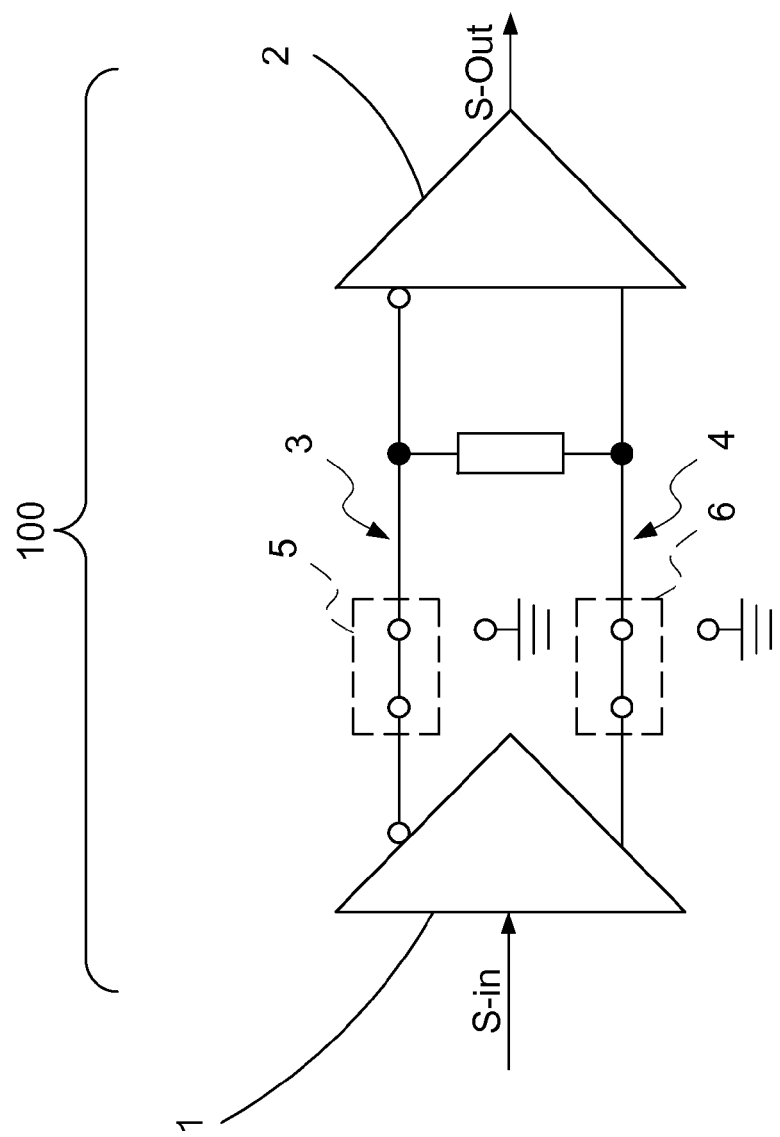
FIG. 1 is a circuit diagram of an LVDS transmitter in the prior art.
Figure 2:
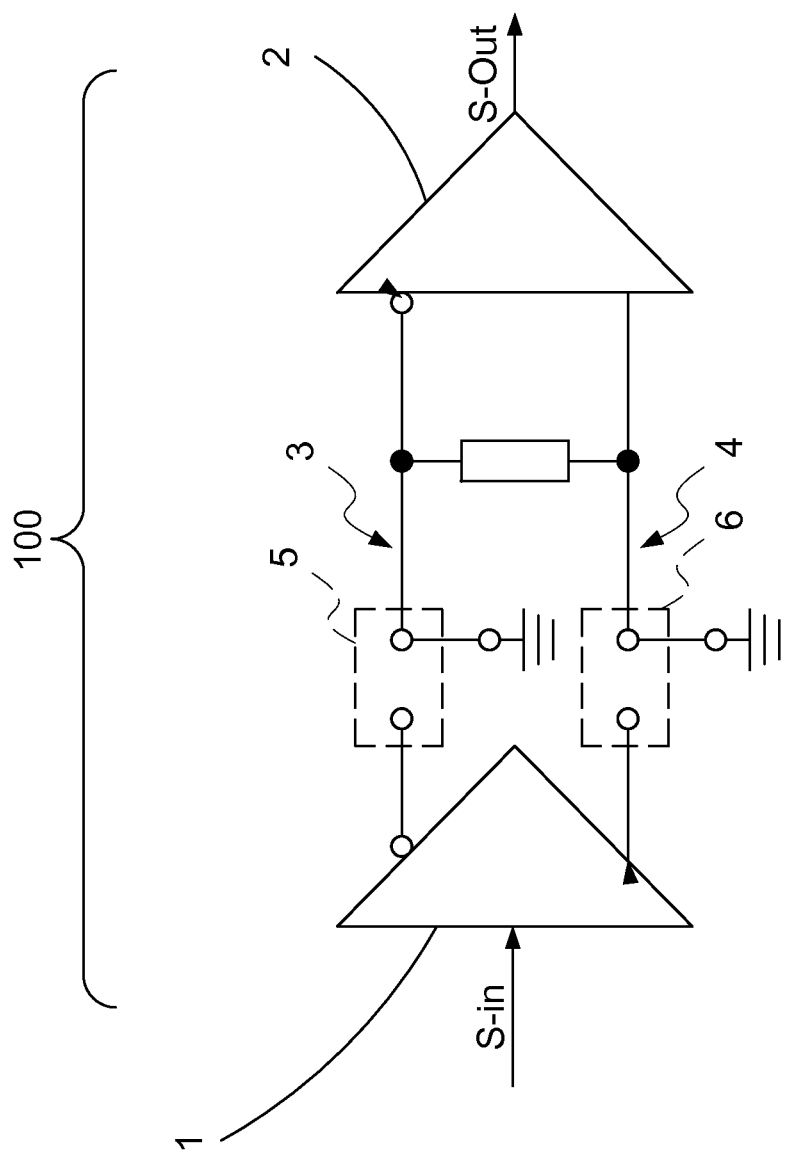
FIG. 2 is a schematic view of cutting off a designated light source signal by an LVDS transmitter in FIG. 1.
Figure 3:
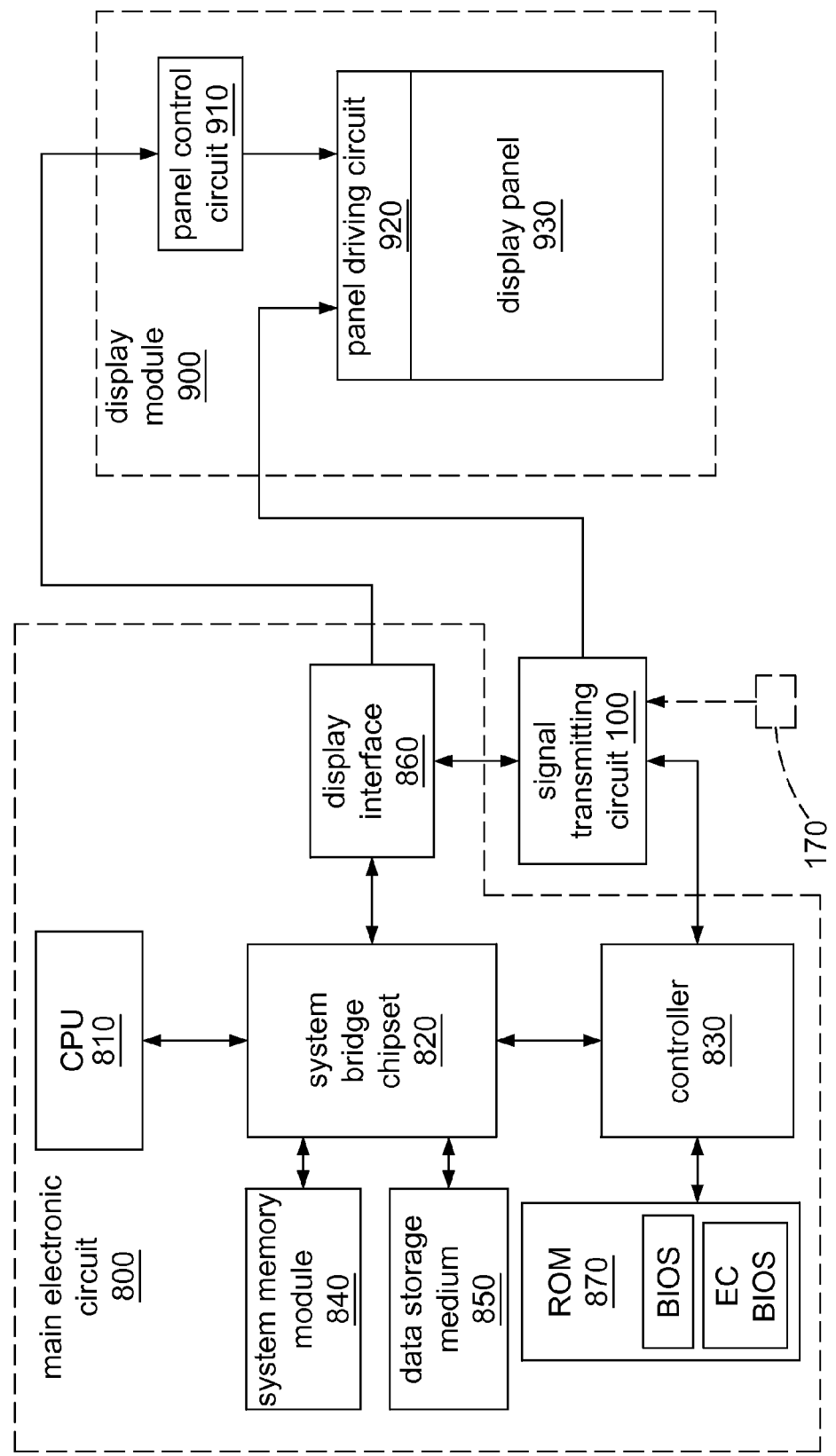
FIG. 3 is a circuit diagram of an electronic apparatus in which a signal transmitting circuit for cutting off driving signal for driving designated light source is applied according to a first embodiment.

Please refer to FIG. 3, the first embodiment provides a signal transmitting circuit 100 for cutting off or outputting a driving signal for driving a designated light source and an electronic apparatus having the signal transmitting circuit 100. The signal transmitting circuit 100 is provided for receiving display signal S-in from a main electronic circuit 800 through a display interface 860 thereof. Through Low-Voltage Differential Signaling (LVDS) mechanism, the signal transmitting circuit 100 converts the display signal S-in into at least one driving signal S-out for driving one or more designated light sources. The signal transmitting circuit 100 also determines to cut off the driving signal S-out or outputting the driving signal S-out to a display module 900; therefore the display module 900 emits designated color light or cuts off the designated color light. Examples of the electronic apparatus include a laptop computer, a display device, tablet computer, a mobile phone, or a personal digital assistant (PDA). Beside these examples, the signal transmitting circuit 100 is applicable to any electronic apparatus having a display module 900, for cutting off the driving signal S-out for driving the designated light source, so as to stop the display module 900 from emitting a designated color light.

In FIG. 3, only the signal transmitting route related to the designated color light (e.g. red light) is drawn in the signal transmitting circuit 100, to illustrate the approach for cutting off or enabling the designated color light (e.g. red light). The signal transmitting route related to the driving signal for driving other light sources is omitted in the drawing and the description. Furthermore, the driving signal S-out for driving the designated light source is not limited to red light related signal. For example, in an RGB display signal transmission architecture, the signal transmitting circuit 100 is applicable to the signal transmitting route related to red light, green light, blue light according to the designated color light required to be cut off. In practice, the display signal transmission architectures include YCbCr (YUV), HDMI, DVI, VGA, etc. The signal transmitting circuit 100 is applicable to the signal transmitting route related to the specific pin according to the designated color light required to be cut off, so as to cut off driving signals for one or more designated light sources. Besides the driving signal S-out, between the main electronic circuit 800 and the display module 900 there are routes for transmitting other signals, e.g. signals for controlling driving voltage, signals for controlling gray-level, signals for displaying other color; these routes for transmitting other signals are also omitted in FIG. 3.

FIG. 3 is a circuit diagram of the electronic apparatus, which includes the signal transmitting circuit 100, the main electronic circuit 800, and the display module 900. Examples of the electronic apparatus include a laptop computer, a display device, a tablet computer, a mobile phone, a PDA, and any electronic apparatus equipped with the display module 900.

As illustrated in FIG. 3, the main electronic circuit 800 of the electronic apparatus includes a central processing unit 810 (CPU 810), a system bridge chipset 820, a controller 830, a system memory module 840, a data storage medium 850, and a display interface 860. In an ordinary portable computer, the system bridge chipset 820 includes the north-bridge chip and the south-bridge chip providing data BUS in different protocols. The description of the embodiment simplifies the north-bridge chip and the south-bridge chip into one single system bridge chip set 820. The CPU 810, the system memory module 840, the data storage medium 850, the display interface 860, and the controller 830 are all electrically connected to the system bridge chipset 820. In one or more embodiment, the controller 830 is an embedded controller (EC) or a keyboard controller (KBC). The controller 830 is electrically connected to the signal transmitting circuit 100. Through the firmware, the controller 830 is equipped with the function for transmitting switching signals to signal transmitting circuit 100. The display interface 860 is provided for generating the display signal S-in.

When the main electronic circuit 800 boots up, the controller 830 initializes each peripheral hardware device, and the CPU 810 loads the Basic-Input-Output-System (BIOS) and KBC BIOS from the read-only memory 870 (ROM 870) through the system bridge chipset 820 and the controller 830. And the CPU 870 also loads the operation system, hardware drivers, and application programs from the data storage medium 850 to start the operation of the main electronic circuit 800.

Figure 4A:
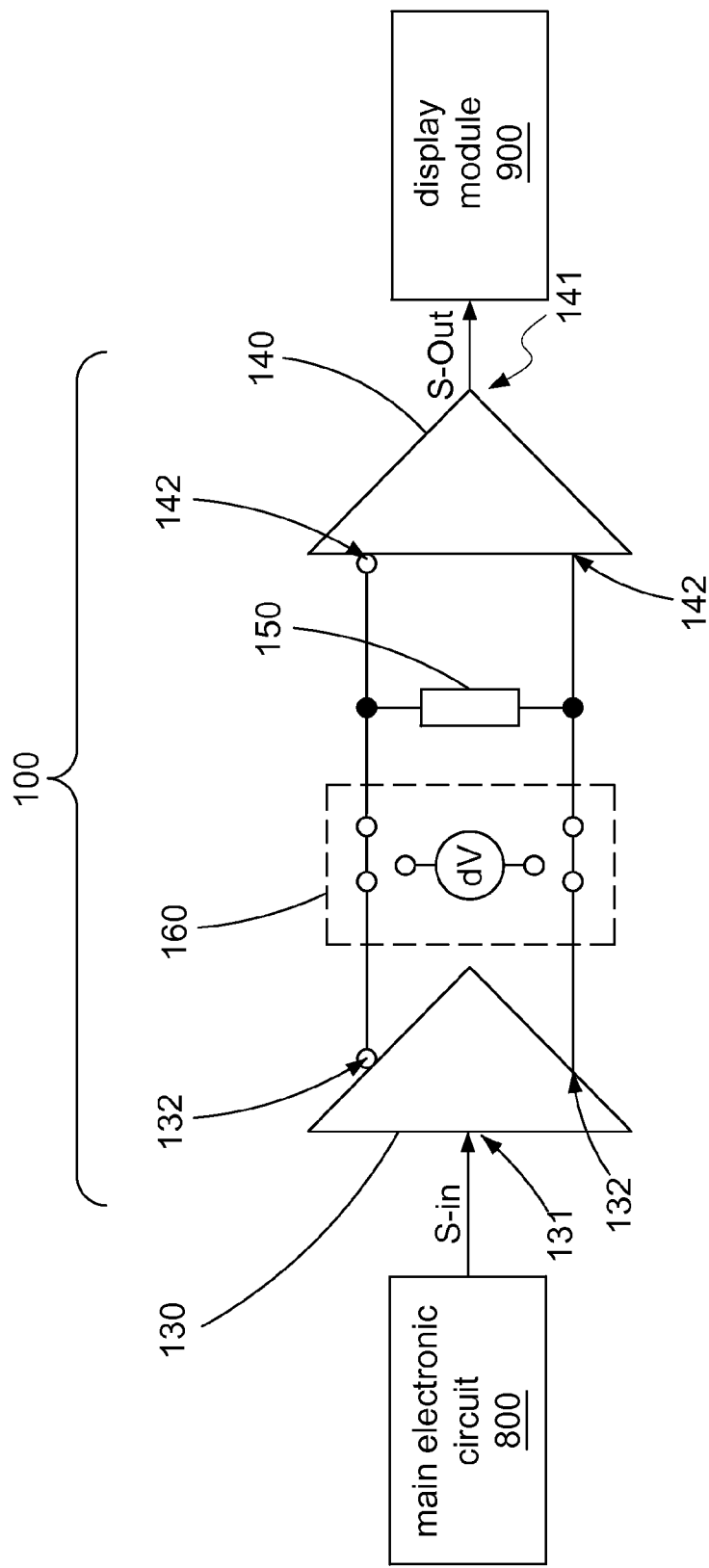
FIGS. 4A and 4B are circuit diagrams of the signal transmitting circuit in the first embodiment.
Figure 4B:
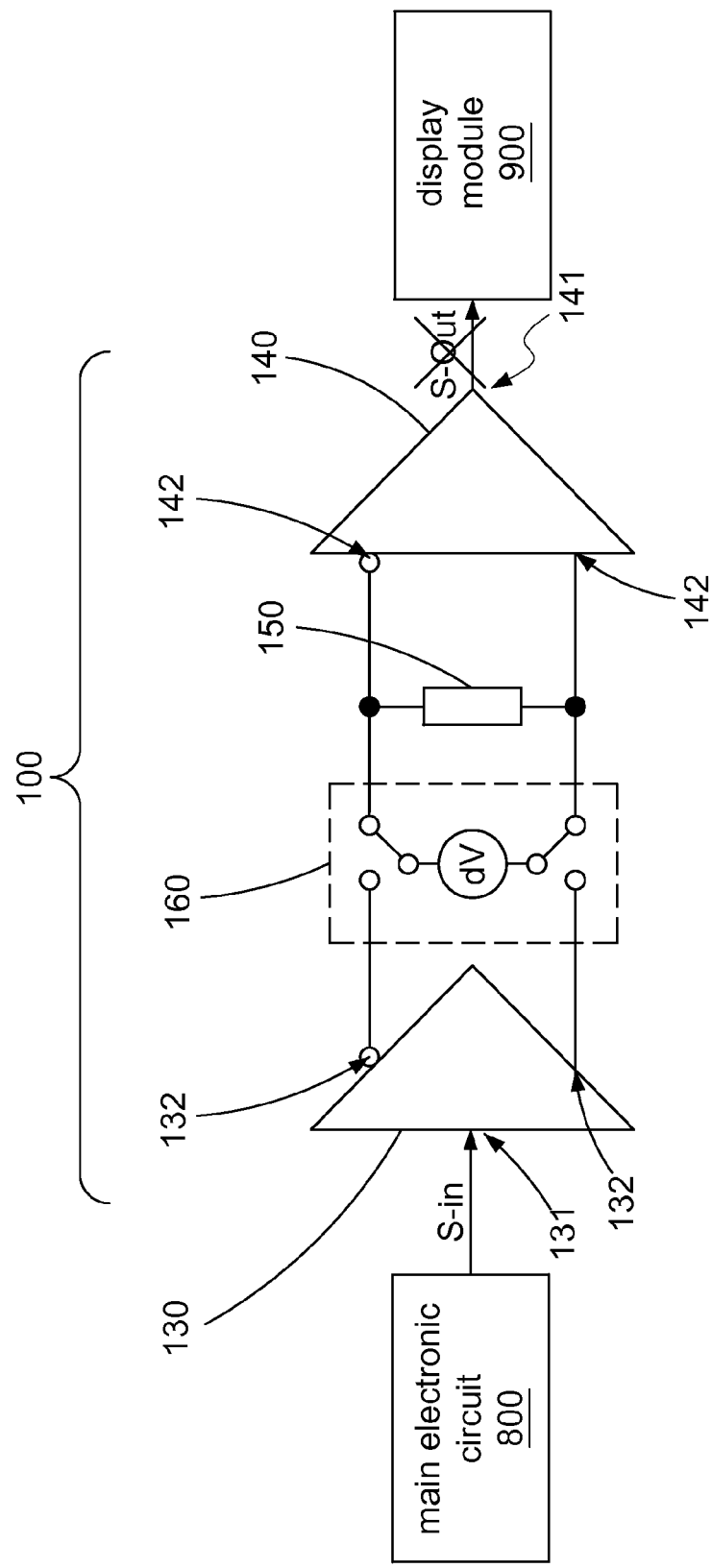

Please refer to FIGS. 4A and 4B, the signal transmitting circuit 100 comprises an input differential signaling driver 130, an output differential amplifier 140, a terminal resistor 150, and a fixed-voltage-level-difference supply device 160.

As shown in FIGS. 4A and 4B, the input differential signaling driver 130 is provided for receiving display signal S-in, and outputting an inverting signal and a non-inverting signal according to the display signal S-in. The input differential signaling driver 130 includes a display signal receiving point 131and two differential signal outputting points 132. The display signal receiving point 131 is electrically connected to the display interface 860 of the main electronic circuit 800, for receiving the display signal S-in. After receiving the display signal S-in, the input differential signaling driver 130 converts the display signal S-in into an inverting signal and a non-inverting signal, and respectively output the inverting signal and the non-inverting signal via two differential signal outputting points 132 of the input differential signaling driver 130. The inverting signal and the non-inverting signal are current signals with a same absolute value and opposite flow directions.

As in FIGS. 4A and 4B, the output differential amplifier 140 is provided for receiving the inverting signal the non-inverting signal, and cutting off or outputting the driving signal S-out for driving the designated light source according to the voltage-level deference between the inverting signal and the non-inverting signal. The output differential amplifier 140 comprises a display signal outputting point 141 and two differential signal receiving points 142.

The output differential amplifier 140 receives the inverting signal and the non-inverting signal through the two differential signal receiving points 142, and compares the inverting signal and the non-inverting signal, so as to generate corresponding driving signal S-out for driving the designated light source and output the driving signal S-out for driving the designated light source to display module 900 through the display signal outputting point 141.

The terminal resistor 150 has two ends electrically connected to the two differential signal receiving points 142 of the output differential amplifier 140 respectively.

As in FIGS. 4A and 4B, the fixed-voltage-level-difference supply device 160 is electrically connected between the input differential signaling driver 130 and the output differential amplifier 140, and is provided to be switched between an enable state and a cut-off state.

As in FIG. 4A, when the fixed-voltage-level-difference supply device 160 is switched to the enable state, the fixed-voltage-level-difference supply device 160 connects the two differential signal outputting points 132 of the input differential signaling driver 130 to the two differential signal receiving points 142 of the output differential amplifier 140. At this time, the output differential amplifier 140 receives the inverting signal and the non-inverting signal, and generates corresponding driving signal S-out for driving the corresponding designated light source, and outputs the driving signal S-out to the display module 900 through the display signal outputting point 141.

As in FIG. 4B, when the fixed-voltage-level-difference supply device 160 is switched to the cut-off state, the fixed-voltage-level-difference supply device 160 supplies a fixed-voltage-level difference dV to the output differential amplifier 140 in the cut-off state. The fixed-voltage-level difference dV replaces the inverting signal and the non-inverting signal. Replacing the inverting signal and the non-inverting signal with the fixed-voltage-level difference dV supplied to the two differential signal receiving points 142 by the fixed-voltage-level-difference supply device 160, the voltage-level difference between the two differential signal receiving points 142 is fixed; therefore, the driving signal for driving the designated light source S-out remains at a low-voltage level or at a fixed-voltage level to cut off the driving signal S-out for the designated light source.

When observing the display module 90 through the NVIS (Night Vision Imaging System, NVIS), the red light of the display module 900 has to be cut off. At this time, the signal transmitting circuit 100 switches the fixed-voltage-level-difference supply device 160 to the cut-off state, As in FIG. 4B. The fixed-voltage-level-difference supply device 160 supplies the fixed-voltage-level difference dV to the two differential signal receiving points 142 of the output differential amplifier 140. Since the voltage-level deference of the two differential signal receiving points 142 is fixed by the fixed-voltage-level difference dV, the driving signal S-out for driving the designated light source remains at low-voltage level no matter how the display signal S-in varies or what noise signals effect.

When supplying the fixed-voltage-level difference dV to the two differential signal receiving points 142 of the output differential amplifier 140, noise signals received by the differential signal receiving point 142 is hard to change the voltage-level of the driving signal S-out for driving the designated light source; therefore the fixed-voltage-level difference dV makes the signal transmitting circuit 100 cut off the red light of the display module 900 efficiently.

FIG. 5A is an example to illustrate how to switch the fixed-voltage-level-difference supply device 160 between the enable state and the cut-off state. In this example, a switcher 170 is electrically connected to the fixed-voltage-level-difference supply device 160. The switcher 170 is provided for outputting a switching signal, and the fixed-voltage-level-difference supply device 160 is provided for receiving the switching signal and switched between the enable state and the cut-off state.

Figure 5B:
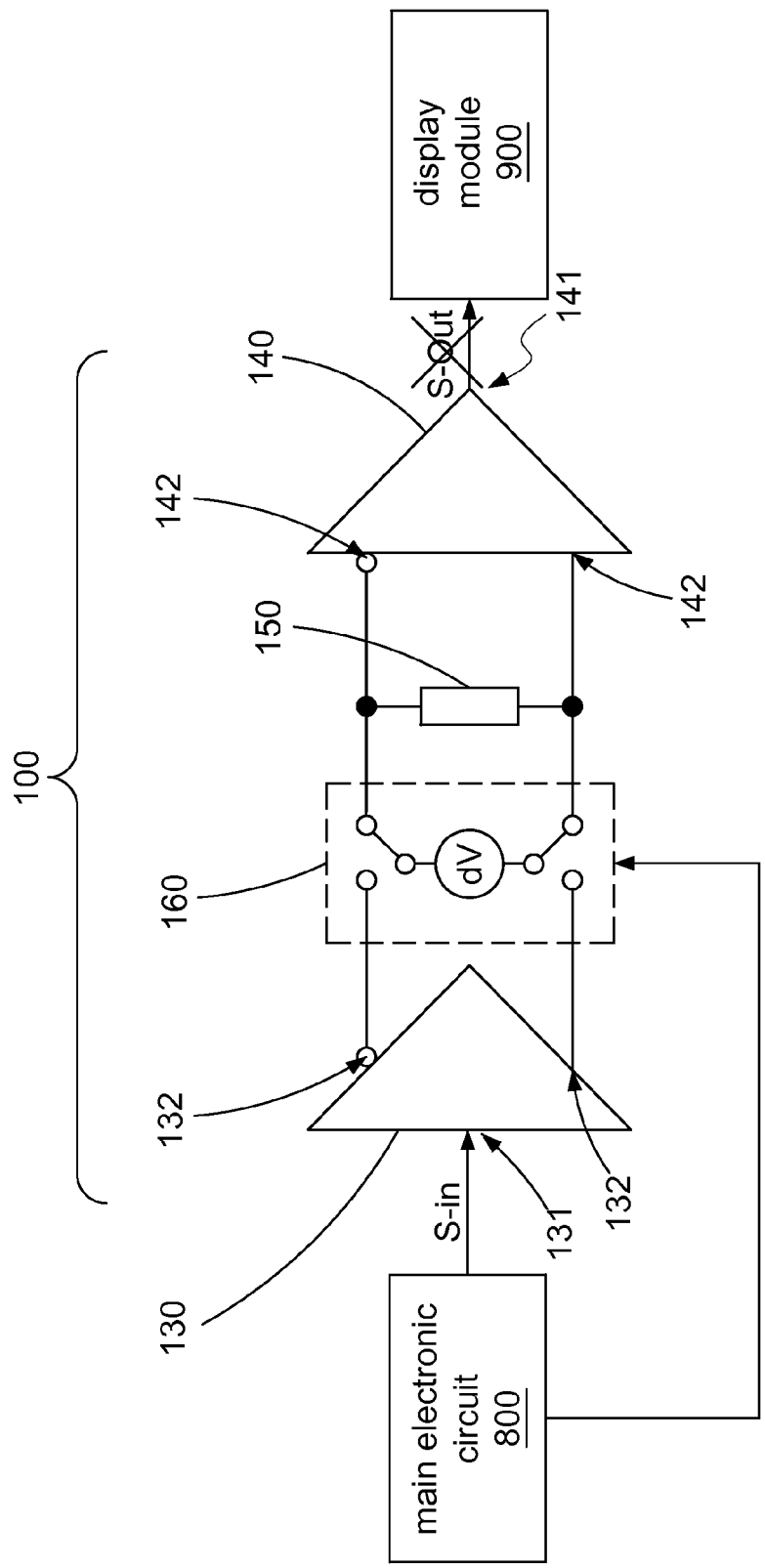

FIG. 5B is another example illustrate how to switch the fixed-voltage-level-difference supply device 160 between the enable state and the cut-off state. In the example, the main electronic circuit 800 output the switching signal, and the fixed-voltage-level-difference supply device 160 receives the switching signal to be switched between the enable state and the cut-off state. Please refer to FIG. 3; the switching signal is output from one of the General-Purpose-Input-Outputs (GPIOs) of the controller 830. By executing an application program, the CPU 810 sends a switching command to the controller 830, and then the controller 830 outputs the switching signal. Or, a button is provided or a set of hot-key is designated for being operated to send the switching command to the controller 830, and then the controller 830 outputs the switching signal.

Figure 6A:
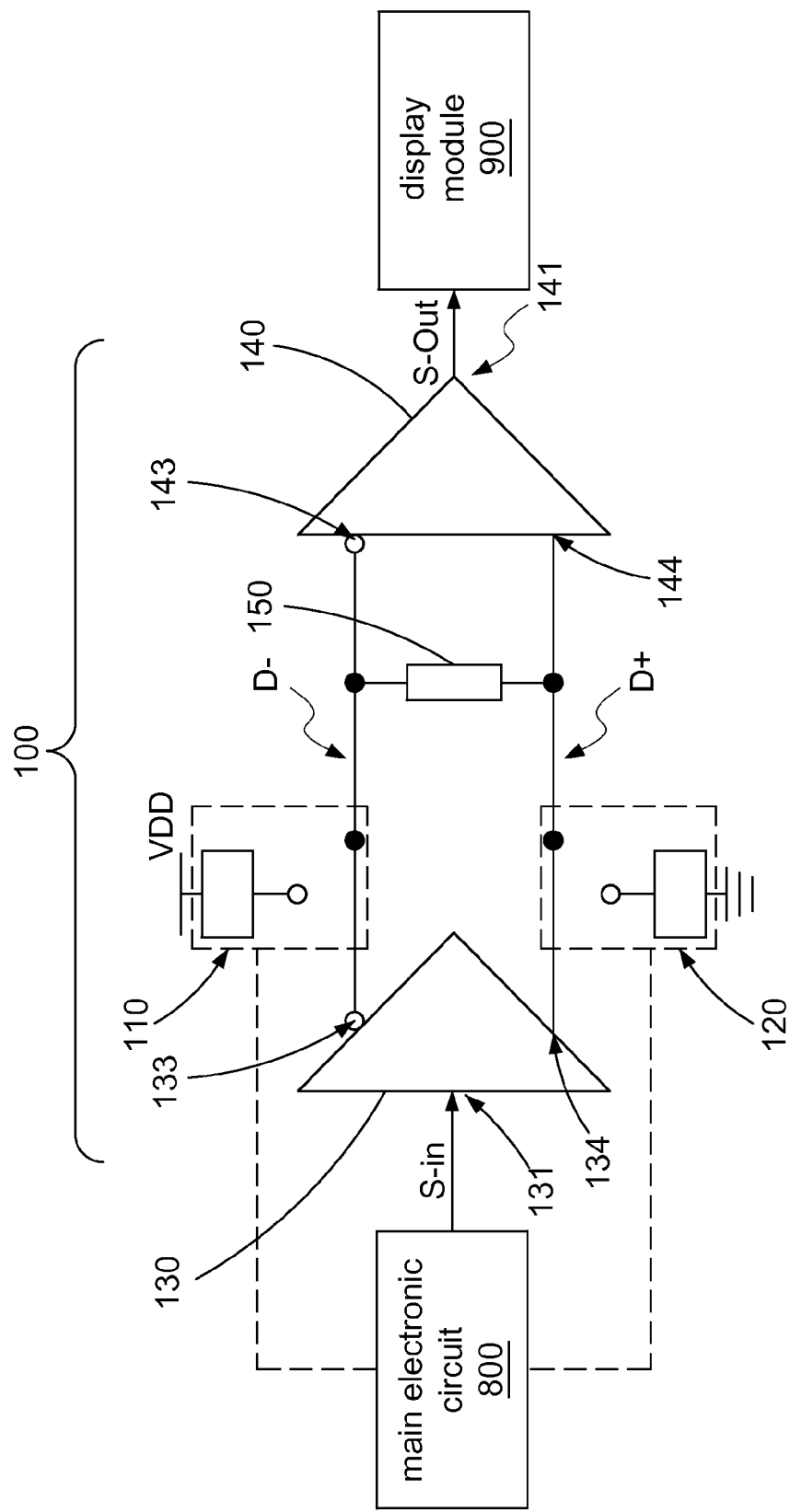
FIGS. 6A and 6B are circuit diagrams of a signal transmitting circuit according to a second embodiment.
Figure 6B:
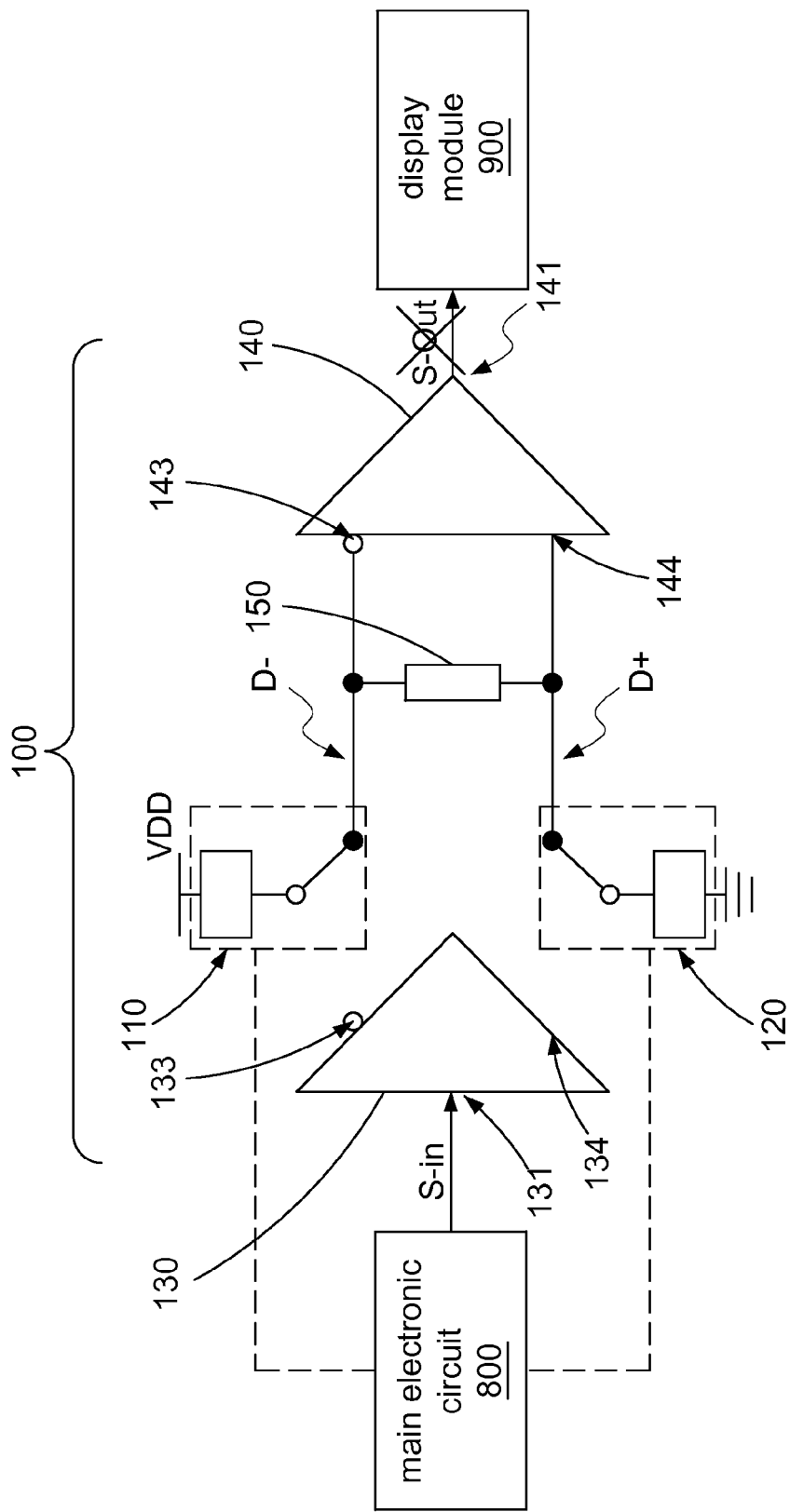

Please refer to FIGS. 6A and 6B, the second embodiment provides a signal transmitting circuit 100 for cutting off or outputting at least one driving signal S-out for driving a designated light source. Similar to the first embodiment, only the signal transmitting route related to the designated color light (e.g. red light) is drawn in the signal transmitting circuit 100, to illustrate the approach for cutting off or enabling the designated color light (e.g. red light). The signal transmitting route related to the driving signal for driving other light sources is omitted in the drawing and the description.

As in FIGS. 6A and 6B, the signal transmitting circuit 100 comprises an input differential signaling driver 130, an output differential amplifier 140, a terminal resistor 150, and a fixed-voltage-level-difference supply device.

As in FIGS. 6A and 6B, the fixed-voltage-level-difference supply device includes a first switching unit 110, a second switching unit 120, and a fixed voltage source VDD.

As in FIGS. 6A and 6B, the input differential signaling driver 130 comprises a display signal receiving point 131 and two differential signal outputting points. An example of the input differential signaling driver 130 is an inverting driver. Two differential signal outputting points of the inverting driver are an inverting outputting point 133 and a non-inverting outputting point 134. The display signal receiving point 131 is electrically connected to the main electronic circuit 800, such that input differential signaling driver 130 receives the display signal S-in through the display signal receiving point 13. The input differential signaling driver 130 converts the display signal S-in into an inverting signal and a non-inverting signal, and outputs the inverting signal and the non-inverting signal through inverting outputting point 133 and the non-inverting outputting point 134.

As in FIGS. 6A and 6B, the output differential amplifier 140 comprises a display signal outputting point 141 and two differential signal receiving points. An example of the output differential amplifier 140 is an inverting amplifier. Two differential signal receiving points of the inverting amplifier are an inverting receiving point 143 and a non-inverting receiving point 144.

As in FIGS. 6A and 6B, the inverting receiving point 143 is electrically connected to the inverting outputting point 133 through an inverting signal line D−. The non-inverting receiving point 144 is electrically connected to the non-inverting outputting point 134 through a non-inverting signal line D+. The output differential amplifier 140 receives the inverting signal and the non-inverting signal through the inverting receiving point 143 and the non-inverting receiving point 144.

The output differential amplifier 140 generates the driving signal S-out according to the voltage-level difference between the inverting signal and the non-inverting signal, and then outputs the driving signal S-out to the display module 900 through the display signal outputting point 141.

Two ends of the terminal resistor 150 are electrically connected to the non-inverting signal line D+ and the inverting signal line D− respectively, therefore, the two ends of the terminal resistor 150 are substantially connected to the inverting receiving point 143 and the non-inverting receiving point 144 of the output differential amplifier 140.

As in FIGS. 6A and 6B, the first switching unit 110 is disposed on the inverting signal line D−, for selectively connecting the inverting signal line D− to the inverting outputting point 133 of the input differential signaling driver 13, or connecting the inverting signal line D− to the fixed voltage source VDD. The second switching unit 120 is disposed on the non-inverting signal line D+, for selectively connecting the non-inverting signal line D+ to the non-inverting outputting point 134 of the input differential signaling driver 130, or switching the non-inverting signal line D+ to be electrically grounded.

Please refer to FIG. 6A, when continuously outputting the driving signal for driving the designated light source S-out to the display module 900 is required, the first switching unit 110 and the second switching unit 120 are respectively switched to the enable state.

In enable state, the first switching unit 110 connects the inverting signal line D− electrically to the inverting outputting point 133 of the input differential signaling driver 130; therefore, the inverting outputting point 133 of the input differential signaling driver 130 is electrically connected to the inverting receiving point 143 of the output differential amplifier 140.

Meanwhile, the second switching unit 120 connects the non-inverting signal line D+ to the non-inverting outputting point 134 of the input differential signaling driver 130; therefore, the non-inverting outputting point 134 of the input differential signaling driver 130 is electrically connected to the non-inverting receiving point 144 of the output differential amplifier 140. The electrical features between the input differential signaling driver 130 and the output differential amplifier 140 is similar to that in an LVDS transmitter; the input differential signaling driver 130 and the output differential amplifier 140 receive the display signal S-in to generate and output corresponding driving signal S-out for driving a designated light source.

As in FIG. 6B, when cutting off red light from the display module 900 is required, the first switching unit 110 and the second switching unit 120 are switched to the cut-off state.

In the cut-off state, the first switching unit 110 connects the inverting signal line D− electrically connected to the fixed voltage source VDD; therefore, the inverting receiving point 143 of the output differential amplifier 14 is electrically connected to the fixed voltage source VDD. Meanwhile, the second switching unit 120 switches the non-inverting signal line D+ to be electrically grounded; therefore, the non-inverting receiving point 144 of the output differential amplifier 140 is electrically grounded. At this time, the fixed voltage source VDD provides a fixed voltage; therefore, a fixed-voltage-level difference dV is supplied to the inverting receiving point 143 of the output differential amplifier 140 and the non-inverting receiving point 144. Since the voltage-level deference of the inverting receiving point 143 and the non-inverting receiving point 144 is fixed by the fixed-voltage-level difference dV, the driving signal S-out remains at low-voltage level, and the display device 900 stops emitting red light.

In FIGS. 6A and 6B, the main electronic circuit 800 sends the switching signal to control the fixed-voltage-level-difference supply device to switch the first switching unit 110 and the second switching unit 120 between the enable state and the cut-off state. The approach for generating the switching signal illustrated in FIGS. 6A and 6B is one of plural examples; an alternative example is to generate the switching signal by the switcher 170 of the first embodiment.

Figure 7:
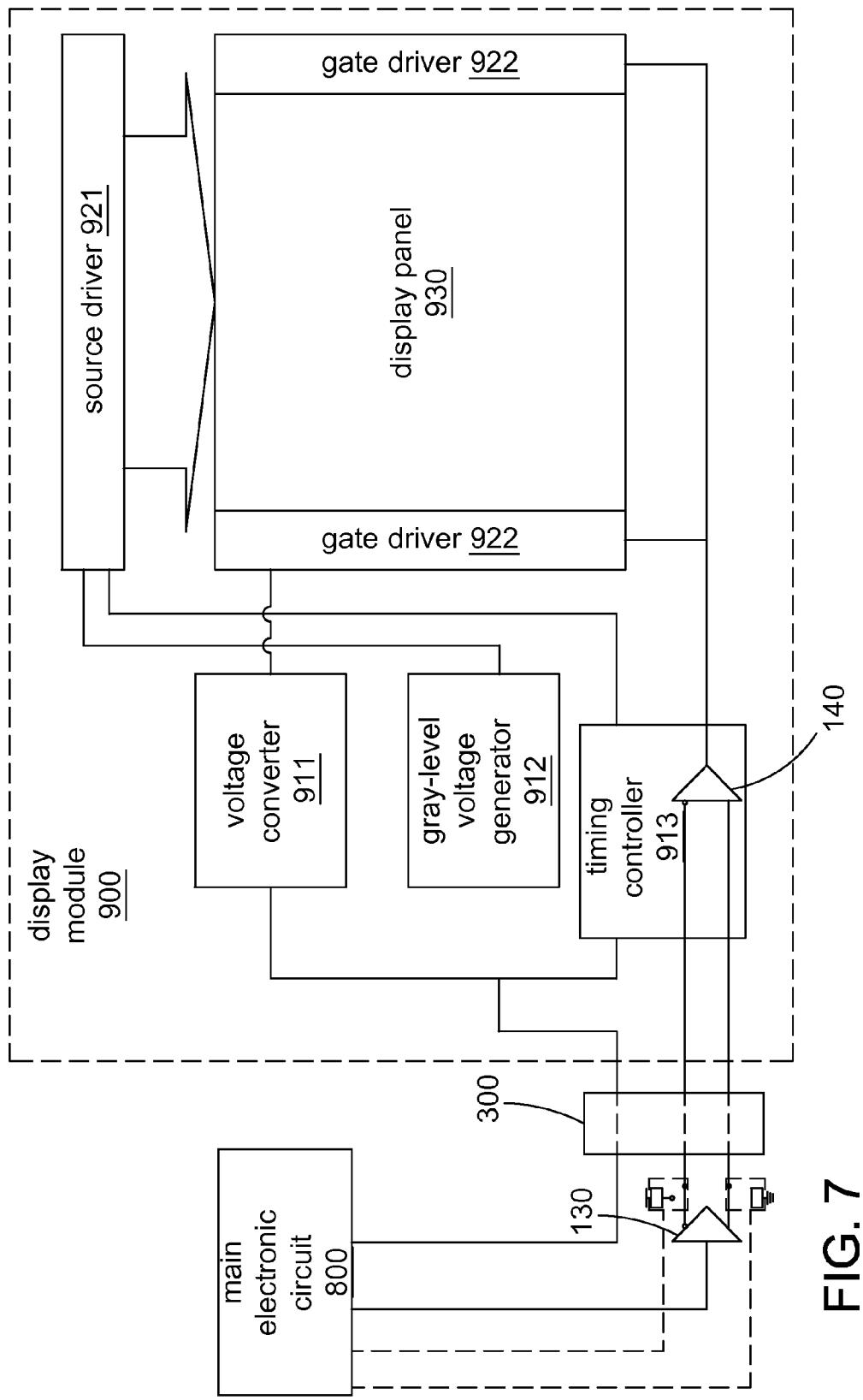
FIGS. 7, 8, 9, and 10 are examples of the second embodiment.

Please refer to FIG. 7, an example according to the first or the second embodiment is illustrated. The display module 900 is a liquid-crystal display module (LCD module), connected to the input differential signaling driver 130 through a connector 300. The display module 900 comprises a panel control circuit, panel driving circuit, display panel 930, and a backlight module. (Not shown in FIG. 7).

The display panel 930 is a liquid-crystal panel including a plurality of pixel cells. Each pixel cell is driven by a Thin-Film-Transistor (TFT) to display images.

The panel driving circuit comprises a source driver 921 and a gate driver 922. The gate driver 922 and the source driver 921 are electrically connected to display panel 930. The source driver 921 is electrically connected to the source of each TFT for driving one of the pixel cells. The gate driver 922 electrically connected to the gate of each TFT for driving one of the pixel cells. The source driver 921 is provided for determine the gray-level voltage applied to the source of each TFT when the corresponding pixel cell is enabled. The gate driver 922 is provided for determine whether to apply a driving voltage to the gate of each TFT to enable the corresponding pixel cell.

The gate driver 922 is electrically connected to the display signal outputting point 141 of the output differential amplifier 140, for receiving the driving signal S-out for driving the designated light source, so as to determine whether to enable the designated pixel cells to be transmit through by the light of the backlight module. In this example, the driving signal S-out for the designated light source is for enabling the pixel cells corresponding to red color.

The panel control circuit comprises voltage converter 911, a gray-level voltage generator 912, and a timing controller 913.

The voltage converter 911 is electrically connected to the gate driver 922 and the gray-level voltage generator 912, for supplying electrically power. The gray-level voltage generator 912 is electrically connected to the source driver 921, for providing gray-level voltage to drive each pixel cell.

The timing controller 913 is provided for controlling the source driver 921, so as to determine the gray-level voltage applied to the source of each TFT when the corresponding pixel cell is enabled. Furthermore, in the signal transmitting circuit 100 of one or more embodiment in this disclosure, the output differential amplifier 140 is integrated into the timing controller 913. The input differential signaling driver 130 is a separated component or integrated into the main electronic circuit 800.

Figure 8:
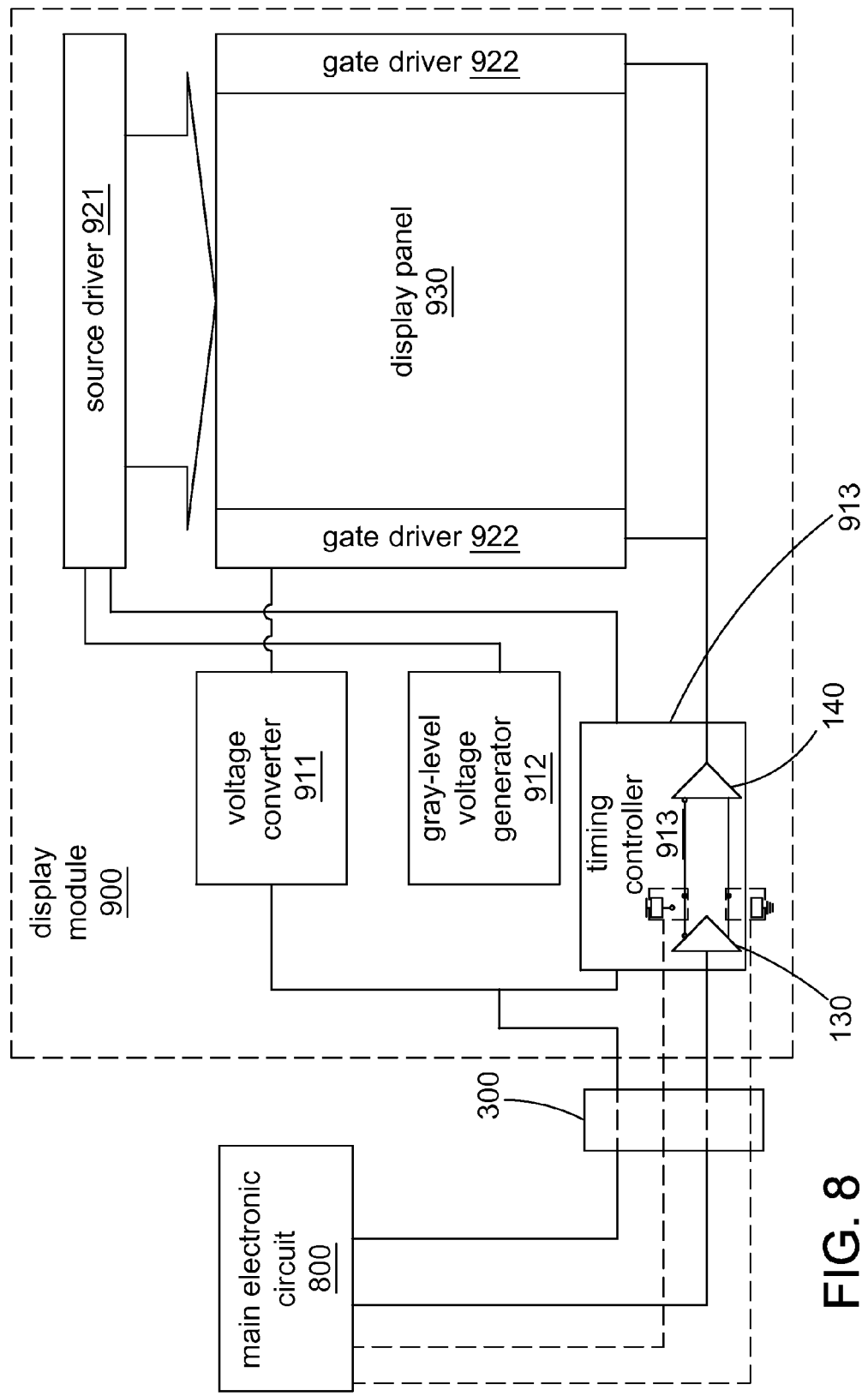

Please refer to FIG. 8, in another example, the input differential signaling driver 130 and the output differential amplifier 140 of the signal transmitting circuit 100 is integrated into the timing controller 913.

Figure 9:
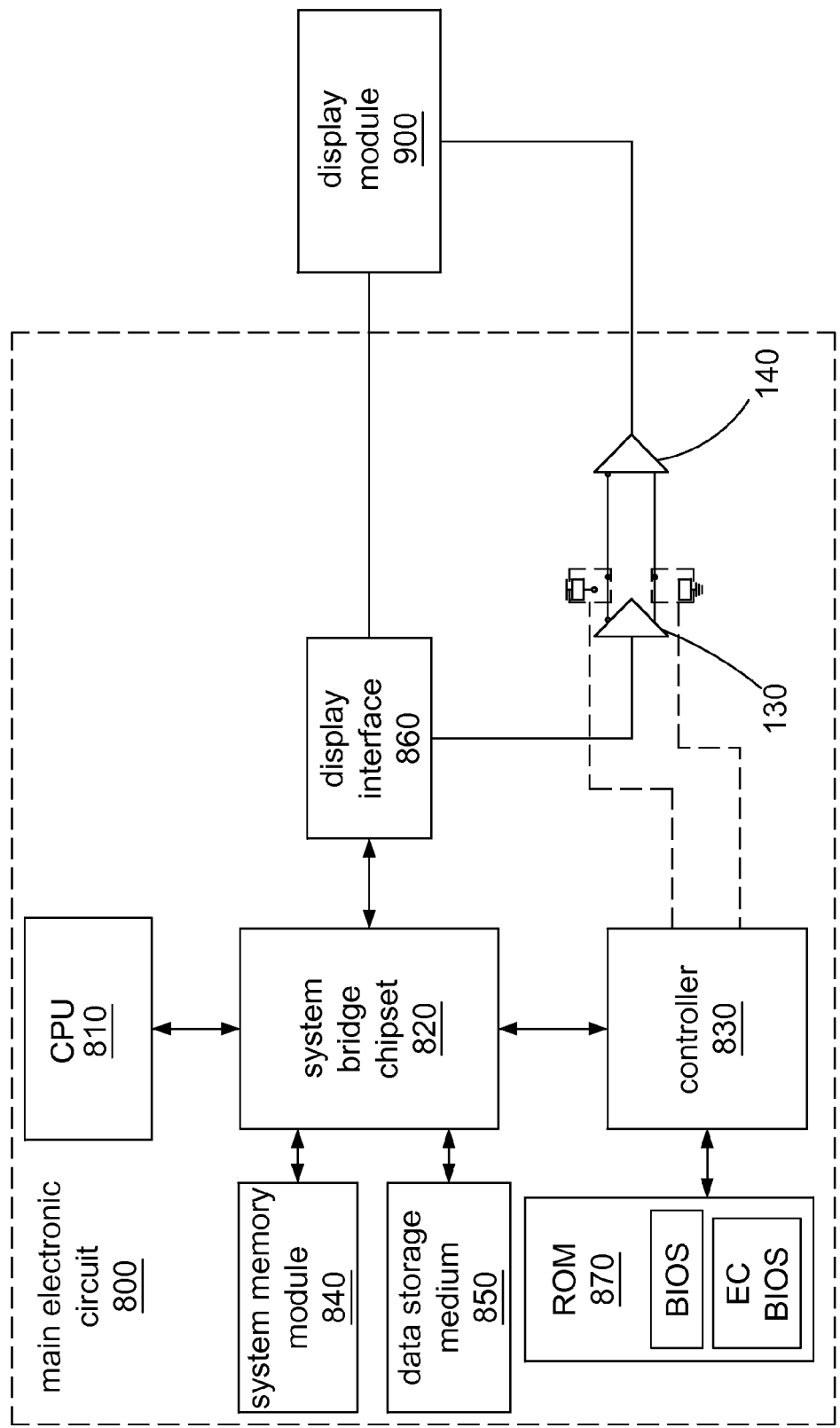

Please refer to FIG. 9, in yet another example; the signal transmitting circuit 100 is electrically connected to another circuit through a connector 300 to form the main electronic circuit 800 of the electronic apparatus. The electronic apparatus is a laptop computer, an all-in-one computer, a tablet computer, or a PDA.

In above examples, the display module 900 is a LCD module, but the example of the display module 900 is not limited to LCD module, the alternative example is a plasma display module, a CRT display module, an OLED (Organic Light-Emitting Diode) display module, etc.

Figure 10:
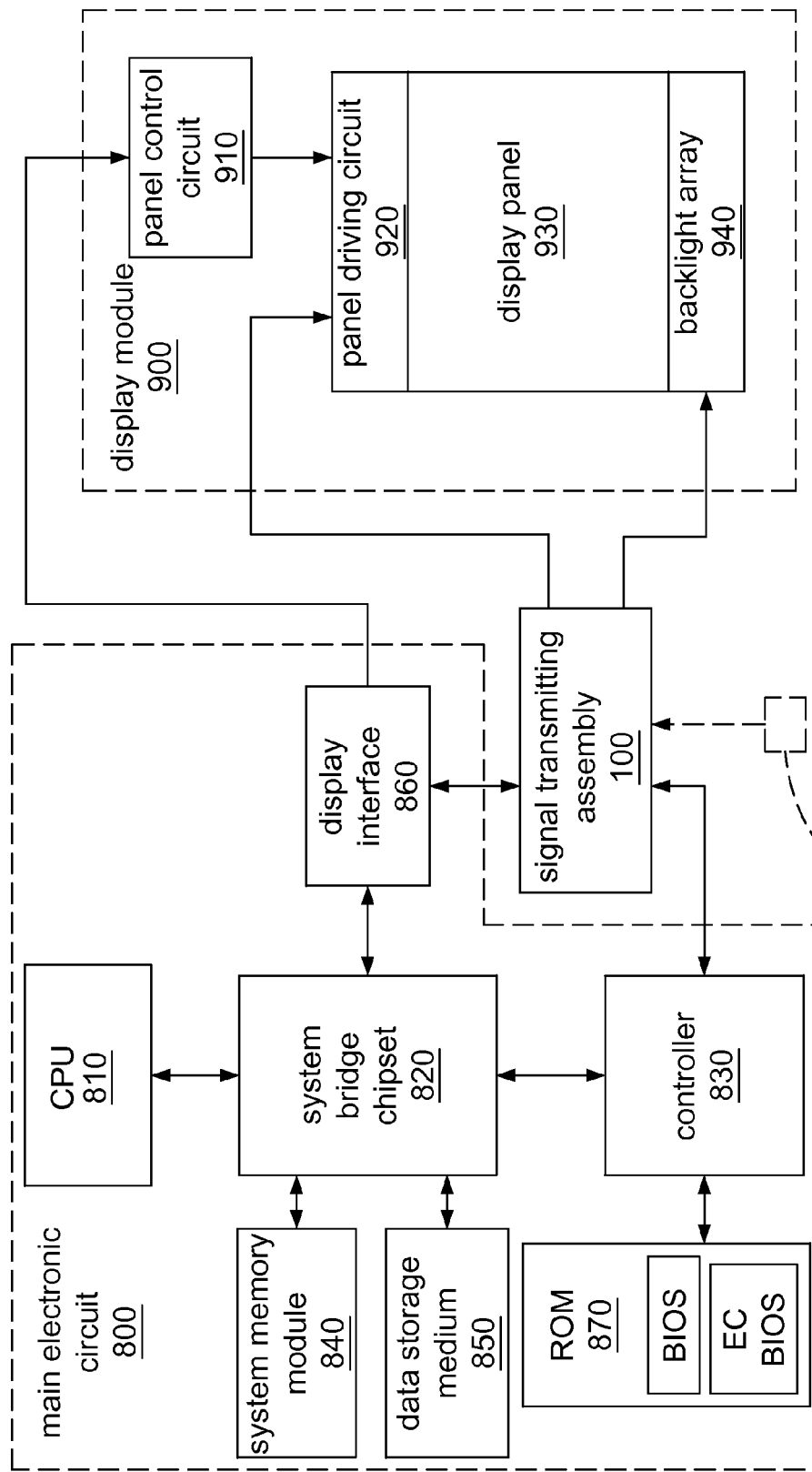

Please refer to FIG. 10, in another example of the LCD display module the approach for cutting off red light is to cut off red light from the backlight array 940 by the signal transmitting circuit 100. The backlight array 940 comprises light sources of various colors. These light sources at least include a red light source. The signal transmitting circuit 100 is for cutting off the driving signal S-out for driving the designated light source (e.g. red light source), so as to disable the designated light source.

Figure 11A:
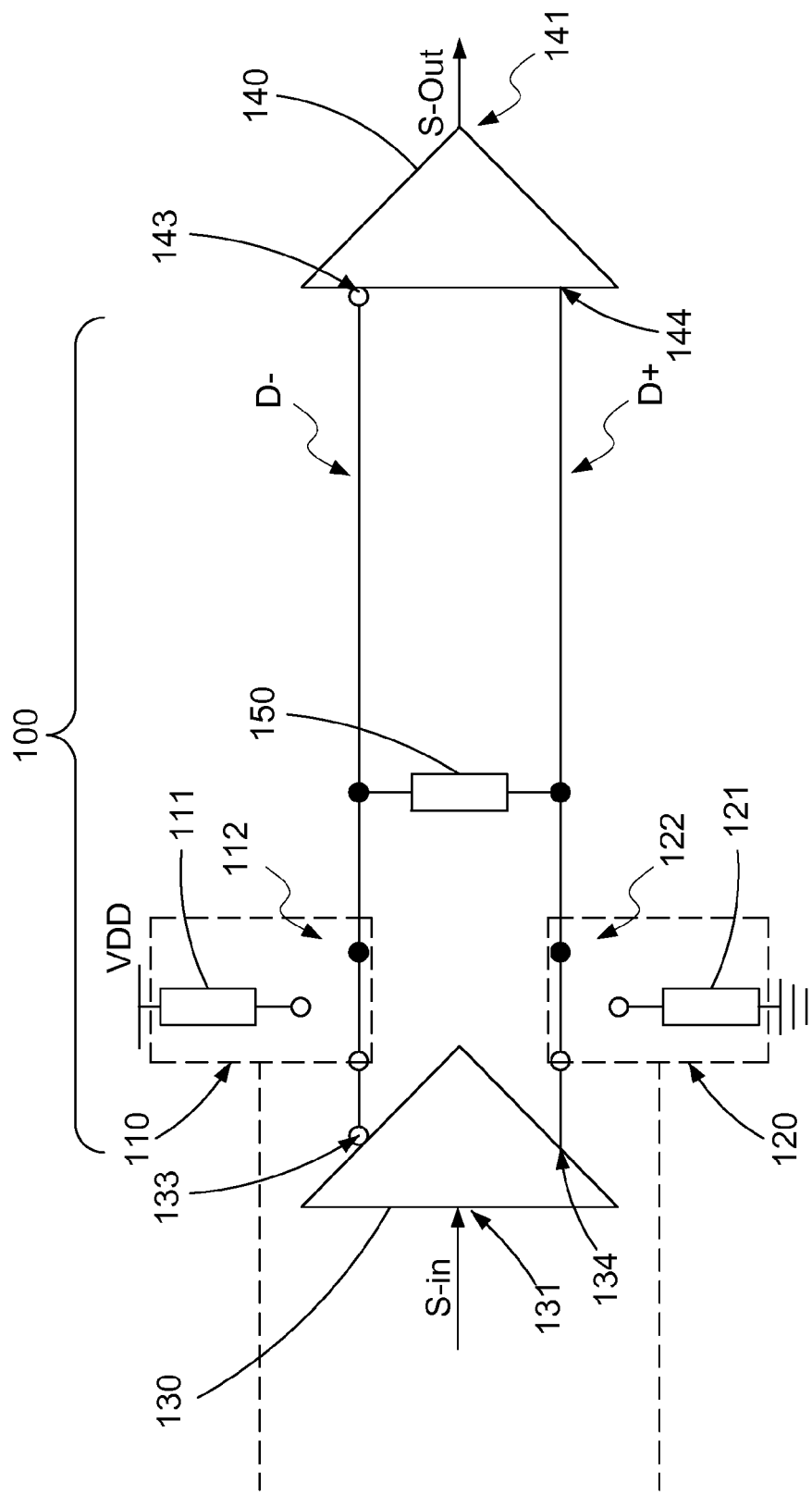
FIGS. 11A and 11B are circuit diagrams of a signal transmitting circuit according to a third embodiment.
Figure 11B:
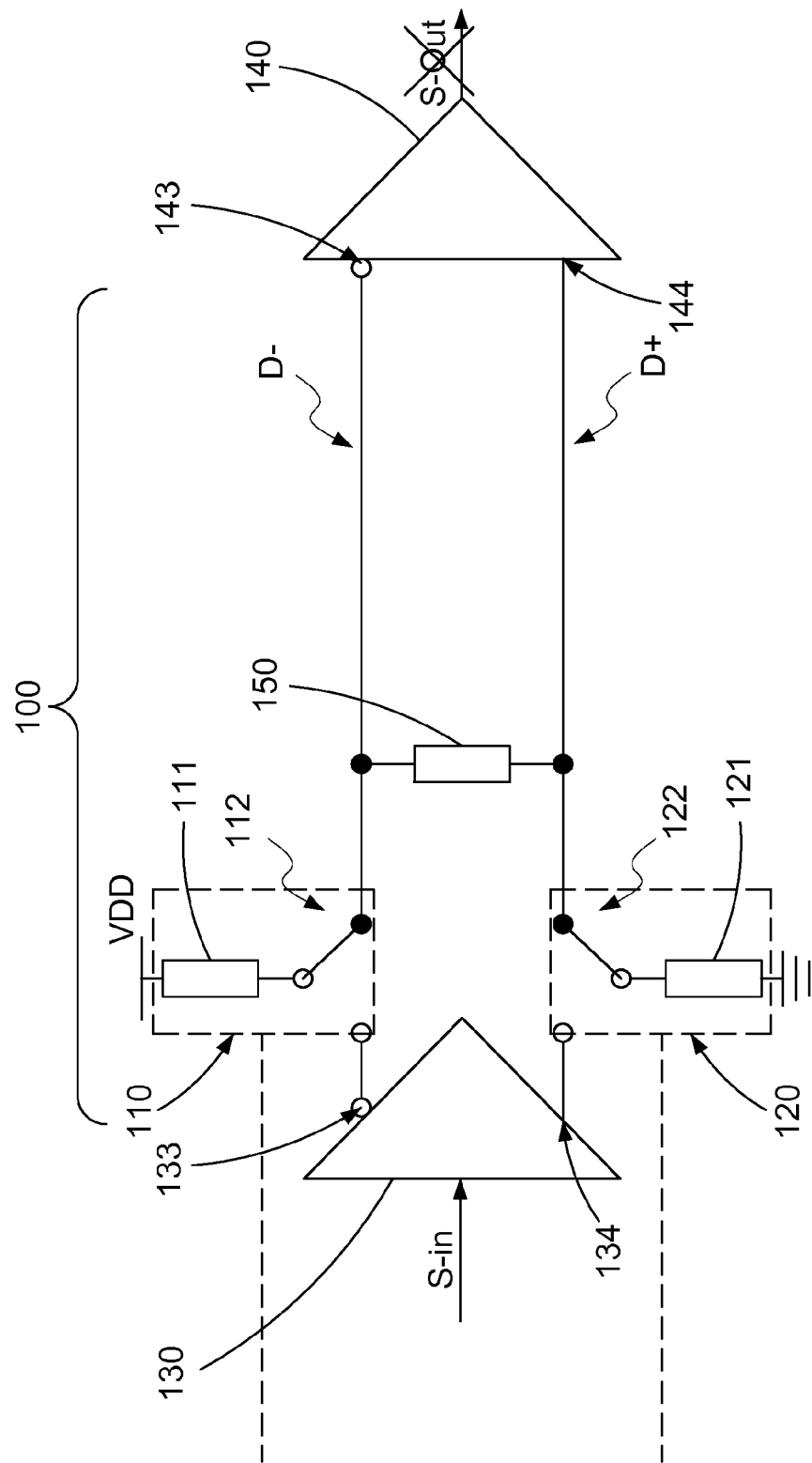

Please refer to FIGS. 11A and 11B, a signal transmitting circuit 100 according to a third embodiment is provided for cutting off or outputting at least one driving signal S-out for a designated light source. Similar to the first embodiment, only the signal transmitting route related to the designated color light (e.g. red light) is drawn in the signal transmitting circuit 100, to illustrate the approach for cutting off or enabling the designated color light (e.g. red light). The signal transmitting route related to the driving signal for driving other light sources is omitted in the drawing and the description.

As in FIGS. 11A and 11B, in the signal transmitting circuit 100 of the third embodiment the first switching unit 110 comprises a voltage reduction resistor 111 and a first change-over switch 112. One end of the voltage reduction resistor 111 is electrically connected to fixed voltage source VDD. The first change-over switch 112 is electrically connected to the inverting receiving point 143 of the output differential amplifier 140 through the inverting signal line D−. The first change-over switch 112 selectively connects the inverting signal line D− electrically to the inverting outputting point 133 of the input differential signaling driver 130 in the enable state, or connects the inverting receiving point 143 to the other end of the voltage reduction resistor 111 in the cut-off state. When the inverting signal line D− electrically is connected to the other end of the voltage reduction resistor 111, the inverting receiving point 143 of the output differential amplifier 140 is electrically connected to the fixed voltage source VDD through the voltage reduction resistor 111.

As in FIGS. 11A and 11B, in the signal transmitting circuit 100 of the third embodiment the second switching unit 120 comprises a ground resistor 121 and a second change-over switch 122. One end of the ground resistor 121 is electrically grounded. The second change-over switch 122 is electrically connected to the non-inverting receiving point 144 of the output differential amplifier 14 through the non-inverting signal line D+. The second change-over switch 122 selectively connects the non-inverting signal line D+ to the non-inverting outputting point 134 of the input differential signaling driver 130 in the enable state, or connects the non-inverting receiving point 144 to the other end of the ground resistor 121 in the cut-off state. When the non-inverting signal line D+ is electrically connected to the other end of the ground resistor 121, the non-inverting receiving point 134 of the input differential signaling driver 130 is electrically grounded through the ground resistor 121.

Please refer to 11A, when transmitting the driving signal S-out for driving the designated light source to the display module 900 is required, the first switching unit 110 and the second switching unit 120 are switched to the enable state.

In the enable state, the first change-over switch 112 connected the inverting signal line D− to the inverting outputting point 133 of the input differential signaling driver 130, therefore, the inverting outputting point 133 of the input differential signaling driver 130 is electrically connected to the inverting receiving point 143 of the output differential amplifier 140. Meanwhile, the second change-over switch 122 connects the non-inverting signal line D+ to the non-inverting outputting point 134 of the input differential signaling driver 130, therefore, the non-inverting outputting point 134 of the input differential signaling driver 130 is electrically connected to the non-inverting receiving point 144 of the output differential amplifier 140.

Lease refer to FIG. 11B, when the red light from the display module 900 has to be cut off, the first switching unit 110 and the second switching unit 120 are switched to the cut-off state.

In the cut-off state, the first change-over switch 112 connects the inverting signal line D− to the voltage reduction resistor 111, therefore, the inverting receiving point 143 of the output differential amplifier 140 is electrically connected to the fixed voltage source VDD through the voltage reduction resistor 111. Meanwhile, the second change-over switch 122 connects the non-inverting signal line D+ to the ground resistor 121, therefore, the non-inverting receiving point 144 of the output differential amplifier 140 is electrically grounded. At this time, a fixed-voltage-level difference is applied between the inverting receiving point 143 and the non-inverting receiving point 144 of the output differential amplifier 140. The fixed-voltage-level difference makes the output differential amplifier 140 output the driving signal S-out for the designated light source corresponding red light at low-voltage level, therefore, the display device 900 stops emitting red light.

Please refer to 12A and 12B, a signal transmitting circuit 100 according to a fourth embodiment is provided for cutting off or outputting at least one driving signal S-out for driving a designated light source. The fourth embodiment provided another example of the fixed-voltage-level-difference supply device 160.

Please refer to 12A and 12B, the fixed-voltage-level-difference supply device 160 comprises a first voltage-supply unit 180, a second voltage-supply unit 190, and a switching unit 200. The first voltage-supply unit 180 is provided for supplying a first voltage V1. The second voltage-supply unit 190 is provided for supplying a second voltage V2, and the second voltage V2 is unequal to the first voltage V1.

Figure 12A:
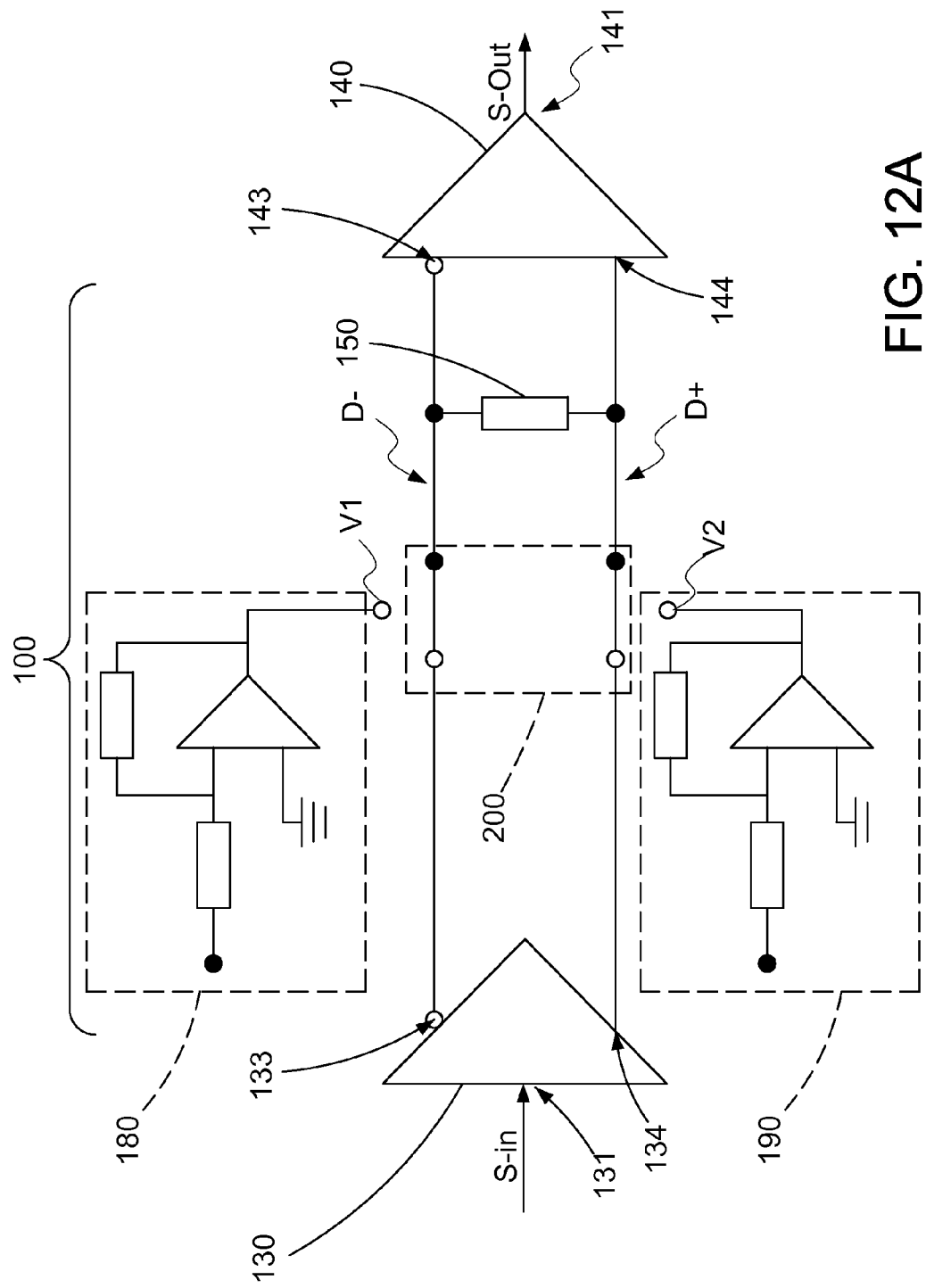
FIGS. 12A and 12B are circuit diagrams of a signal transmitting circuit according to a fourth embodiment.
Figure 12B:
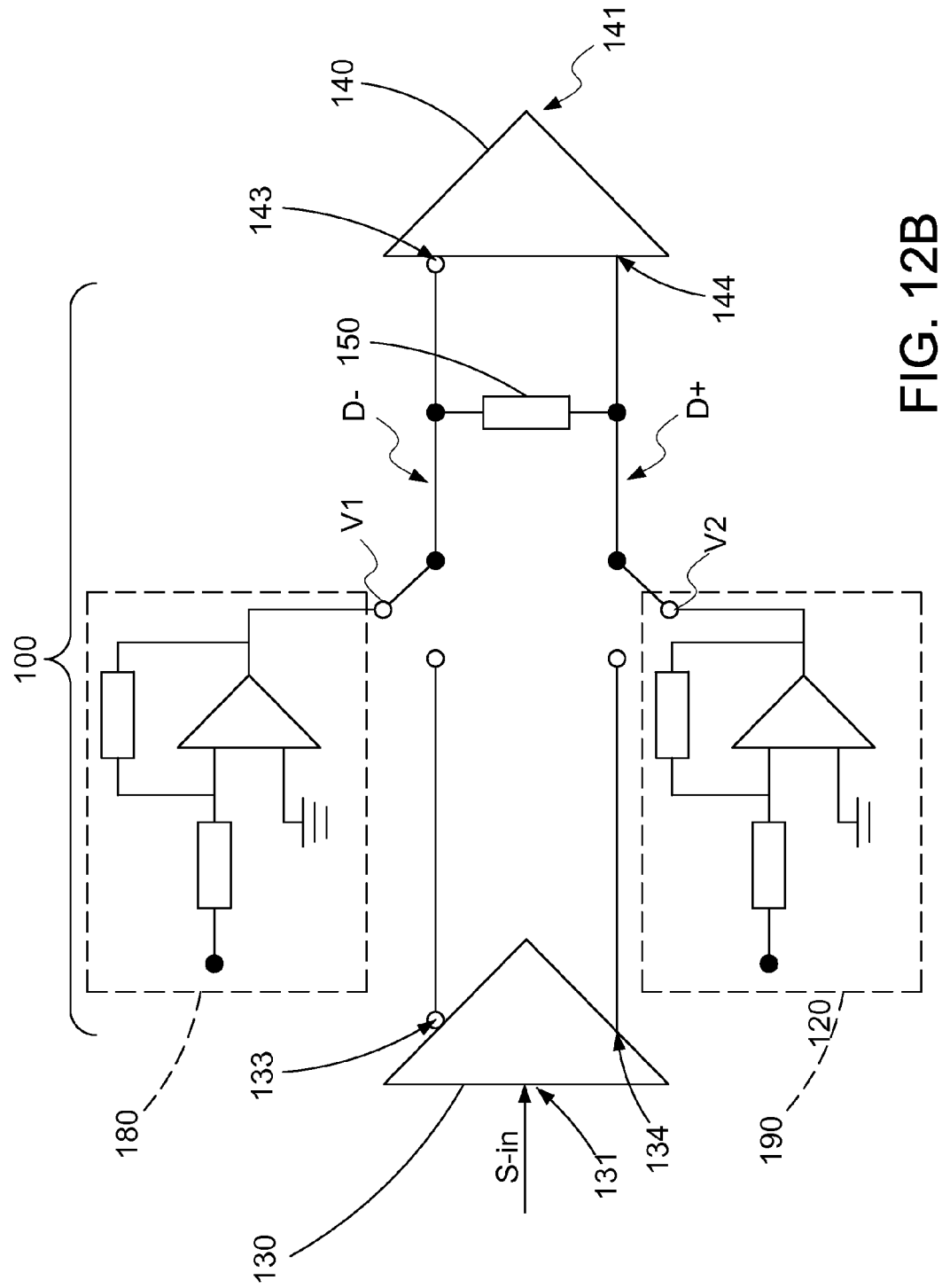

As in FIGS. 12A and 12B, the switching unit 200 is connected between the input differential signaling driver 130 and the output differential amplifier 140, and the switching unit 200 is provided to be switched between an enable state and a cut-off state.

As in FIG. 12A, when the switching unit 200 is switched to the enable state, the switching unit 200 connects the inverting signal line D− electrically to the inverting outputting point 133 of the input differential signaling driver 130, therefore, the inverting outputting point 133 of the input differential signaling driver 130 is electrically connected to the inverting receiving point 143 of the output differential amplifier 140. Meanwhile, the switching unit 200 also connects the non-inverting signal line D+ to the non-inverting outputting point 134 of the input differential signaling driver 130; therefore, the non-inverting outputting point 134 of the input differential signaling driver 130 is electrically connected to the non-inverting receiving point 144 of the output differential amplifier 140. The electrical features between the input differential signaling driver 130 and the output differential amplifier 140 is similar to that in an LVDS transmitter; the input differential signaling driver 130 and the output differential amplifier 140 receive the display signal S-in to generate and output corresponding driving signal S-out for driving a designated light source.

As in FIG. 12B, when the red light emitting from the display module 900 has to be cut off, the switching unit 200 is switched to the cut-off state. The switching unit 200 connects the inverting signal line D− to first voltage-supply unit 180, therefore, the inverting outputting point 133 of the input differential signaling driver 130receives the first voltage V1. Meanwhile, the switching unit 200 connects the non-inverting signal line D+ to the second voltage-supply unit 190; therefore the non-inverting receiving point 144 of the output differential amplifier 140 receives the second voltage V2. At this time, a fixed-voltage-level difference (V1−V2) is applied to the inverting receiving point 143 and the non-inverting receiving point 144 of the output differential amplifier 140. The fixed-voltage-level difference (V1−V2) makes the output differential amplifier 140 output the driving signal S-out for the designated light source corresponding red light at low-voltage level, therefore, the display device 900 stops emitting red light.

Figure 13:
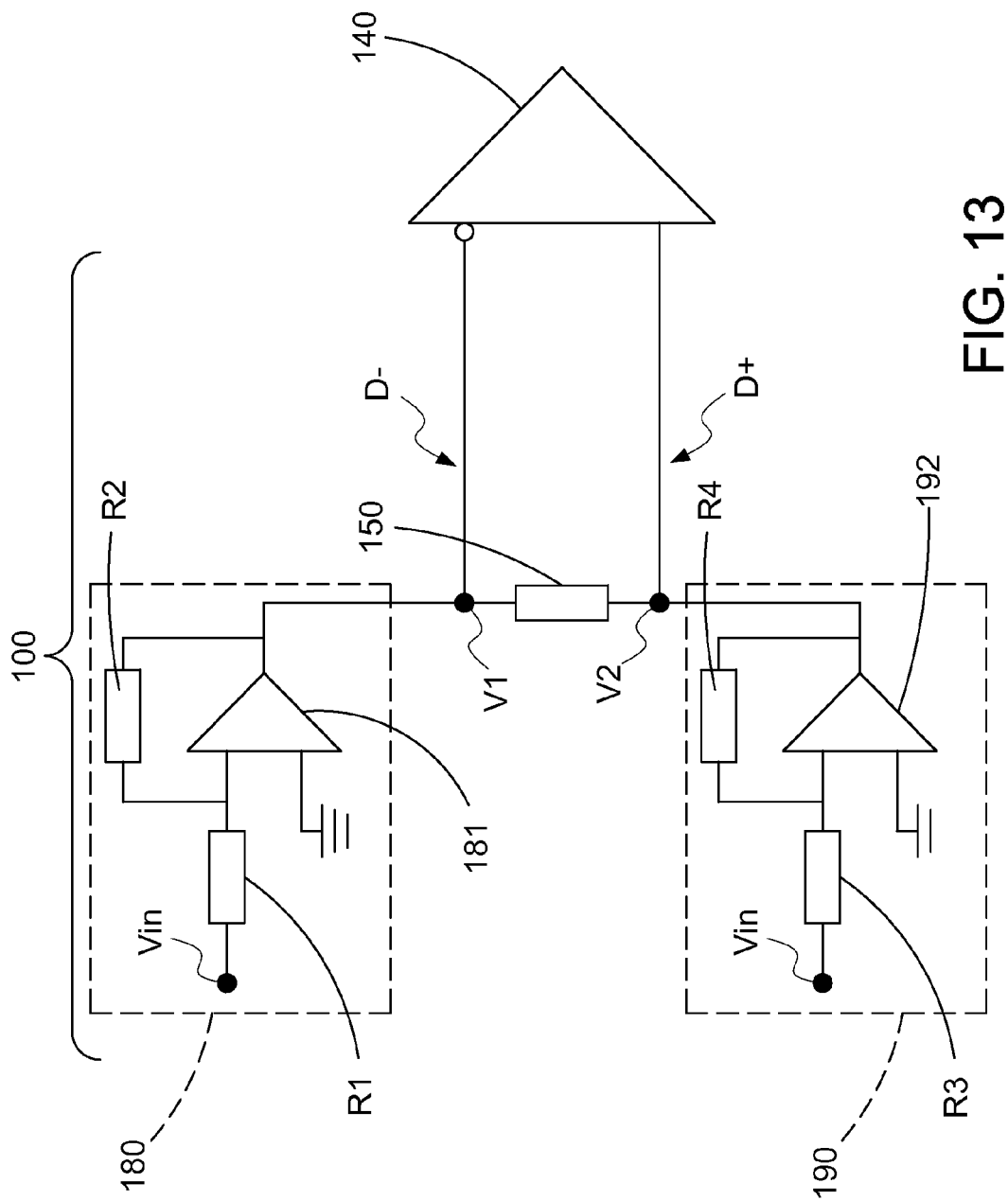
FIG. 13 is a partial circuit diagram of the signal transmitting circuit in the fourth embodiment.

FIG. 13 illustrates the electrical features in FIG. 12B and details of the first voltage-supply unit 180 and the second voltage-supply unit 190.

The first voltage-supply unit 180 comprises a first non-inverting amplifier 181, a first resistor R1 having a first resistance value, a second resistor R2 having a second resistance value. The first non-inverting amplifier 181 comprises two first receiving points and a first outputting point. One of the two first receiving points receives an input voltage Vin through the first resistor R1. The other first receiving point is electrically grounded. The second resistor R2 is connected to the first resistor R1 and the first outputting point, therefore, the first voltage V1 is supplied to the first outputting point.

The second voltage-supply unit 190 comprises a second non-inverting amplifier 192, a third resistor R3 having a first resistance value, a fourth resistor R4 having a third resistance value. The second non-inverting amplifier 192 comprises two second receiving points and a second outputting point. One of the two second receiving points receives the input voltage Vin through the third resistor R3. The other end of the second receiving point is electrically grounded. The fourth resistor R4 connects the third resistor R3 and the second outputting point, therefore, the second voltage V2 is supplied to the second outputting point.

Through the adjustment of the first resistor R1, the second resistor R2, the third resistor R3, and the fourth resistor R4, the adjustment of the first voltage V1 and the second voltage V2 is achieved. As a result, the fixed-voltage-level difference (V1−V2) is adjusted to make the driving signal S-out at a low-voltage level, and the display device 900 stops emitting red light.

While the present invention has been described by the way of example and in terms of the preferred embodiments, it is to be understood that the invention need not to be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An electronic apparatus, comprising:
   a signal transmitting circuit, for cutting off or outputting a driving signal for driving a designated light source, comprising:
      an input differential amplifier, configured to receive a display signal, and output an inverting signal and a non-inverting signal according to the display signal;
      an output differential amplifier; and
      a fixed-voltage-level-difference supply device, electrically connected between the input differential amplifier and the output differential amplifier, the fixed-voltage-level-difference supply device configured to be switched to between an enable state and a cut-off state, wherein:
         in the enable state, the inverting signal and the non-inverting signal from the input differential amplifier are supplied to the output differential amplifier, and the output differential amplifier outputs the driving signal for driving the designated light source according to the voltage-level difference between the inverting signal and the non-inverting signal; and
         in the cut-off state, a fixed-voltage-level difference is supplied by the fixed-voltage-level-difference supply device to the output differential amplifier in place of the inverting signal and the non-inverting signal, so as to switch the output differential amplifier to cut off the driving signal, wherein the fixed-voltage-level difference comprises two fixed signals that are different in value;
   a display panel, comprising a plurality of pixel cells;
   a panel driving circuit, for receiving the driving signal for driving the designated light source from the output differential amplifier, configured to enable at least one of the plurality of pixel cells of the display panel;
   a main electronic circuit, at least comprising a central processing unit, a system bridge chipset, a controller, a system memory module, a data storage medium and a display interface;

wherein the central processing unit, the system memory module, the data storage medium, the display interface and the controller are electrically connected to the system bridge chipset, and the display interface is configured to generate the driving signal for driving the designated light source and transmitting the driving signal to the input differential amplifier.

2. The electronic apparatus as claimed in claim 1, wherein the input differential amplifier further comprises:
   a display signal receiving point, for receiving the driving signal for driving the designated light source; and
   two differential signal outputting points, for respectively outputting the inverting signal and the non-inverting signal.

3. The electronic apparatus as claimed in claim 2, wherein the output differential amplifier comprises:
   two differential signal receiving points, for receiving the inverting signal and the non-inverting signal;
   a display signal outputting point, for outputting the driving signal for driving the designated light source.

4. The electronic apparatus as claimed in claim 3, configured such that:
   when the fixed-voltage-level-difference supply device is switched between the cut-off state and the enable state, and the fixed-voltage-level-difference supply device in the enable state connects the two differential signal outputting points of the input differential amplifier to the two differential signal receiving points of the output differential amplifier; and
   when the fixed-voltage-level-difference supply device in the cut-off state supplies the fixed-voltage-level difference to the two differential signal receiving points of the output differential amplifier.

5. The electronic apparatus as claimed in claim 3, further comprising a terminal resistor having two end electrically connected to the two differential signal receiving points of the output differential amplifier.

6. The electronic apparatus as claimed in claim 3, wherein the fixed-voltage-level-difference supply device is for receiving a switching signal to be switched between the enable state and the cut-off state.

7. The electronic apparatus as claimed in claim 6, further comprising a switcher, electrically connected to the fixed-voltage-level-difference supply device for outputting the switching signal.

8. The electronic apparatus as claimed in claim 3, wherein:
   the input differential amplifier is a an inverting driver, and the two differential signal outputting points of the input differential amplifier are an inverting outputting point for outputting the inverting signal and a non-inverting outputting point for outputting the non-inverting signal;
   the output differential amplifier is an inverting amplifier, and the two differential signal receiving points of the output differential amplifier are an inverting receiving point and a non-inverting receiving point; and
   the fixed-voltage-level-difference supply device comprises:
      a fixed voltage source, for providing a fixed-voltage;
      a first switching unit, selectively enabling the inverting outputting point of the input differential amplifier to be electrically coupled to the inverting receiving point of the output differential amplifier in the enable state, or enabling the inverting receiving point of the output differential amplifier to be electrically connected to the fixed voltage source in the cut-off state; and
      a second switching unit, selectively enabling the non-inverting outputting point of the input differential amplifier to be electrically connected to the non-inverting receiving point of the output differential amplifier in the enable state, or enabling the non-inverting receiving point of the output differential amplifier to be electrically grounded in the cut-off state.

9. The electronic apparatus as claimed in claim 8, further comprising a terminal resistor having two end electrically connected to the inverting receiving point and the non-inverting receiving point of the output differential amplifier.

10. The electronic apparatus as claimed in claim 8, wherein the first switching unit comprises:
    a voltage reduction resistor, having one end electrically connected to the fixed voltage source; and
    a first change-over switch, electrically connected to the inverting receiving point of the output differential amplifier, and selectively enabling the inverting receiving point to be electrically connected to the inverting outputting point of the input differential amplifier in the enable state; or enabling the inverting receiving point electrically to be connected to the other end of the voltage reduction resistor in the cut-off state.

11. The electronic apparatus as claimed in claim 8, wherein the second switching unit comprises:
    a ground resistor, having one end electrically grounded; and
    a second change-over switch, electrically connected to the non-inverting receiving point of the output differential amplifier, and selectively enabling the non-inverting receiving point to be electrically connected to the non-inverting outputting point of the input differential amplifier in the enable state; or enabling the non-inverting receiving point to be electrically connected to the other end of the ground resistor in the cut-off state.

12. The electronic apparatus as claimed in claim 1, wherein the fixed-voltage-level-difference supply device comprises:
    a first voltage-supply unit, for supplying a first voltage;
    a second voltage-supply unit, for supplying a second voltage which is unequal to the first voltage; and
    a switching unit, electrically connected between the input differential amplifier and the output differential amplifier, and selectively connecting the output differential amplifier to the first voltage-supply unit and the second voltage-supply unit in the cut-off state, so as replace the inverting signal and the non-inverting signal with the first voltage and the second voltage.

13. The electronic apparatus as claimed in claim 12, wherein:
    the first voltage-supply unit comprises:
       a first resistor;
       a first non-inverting amplifier, having two first receiving points and a first outputting point, in which one of the two first receiving point receives an input voltage through the first resistor, and the other first receiving point is electrically grounded; and
       a second resistor, electrically connected to the first resistor and the first outputting point, so as to supply the first voltage to the first outputting point of the first non-inverting amplifier; and
    the second voltage-supply unit comprises:
       a third resistor;
       a second non-inverting amplifier, having two second receiving points and a second outputting point, in which one of the two second receiving point receives the input voltage through the third resistor, and the other second receiving point is electrically grounded; and a fourth resistor, electrically connected to the third resistor and the second outputting point, so as to supply the second voltage to the second outputting point of the second non-inverting amplifier.

14. The electronic apparatus as claimed in claim 1, wherein the inverting signal and the non-inverting signal are current signals with a same absolute value and opposite flow directions.

15. The electronic apparatus as claimed in claim 1, wherein the electronic apparatus is a laptop computer, a display device, a tablet computer, a mobile phone, or a personal digital assistant.

* * * * *